United States Patent [19]
Kaneko

[11] Patent Number: 5,878,890
[45] Date of Patent: Mar. 9, 1999

[54] CARRIER TAPE

[75] Inventor: Satoshi Kaneko, Toyoake, Japan

[73] Assignee: Kaneko Denki Kabushiki Kaisha, Nagoya, Japan

[21] Appl. No.: 940,879

[22] Filed: Sep. 30, 1997

[51] Int. Cl.[6] .................................................. B65D 85/38
[52] U.S. Cl. ......................... 206/714; 206/716; 206/725
[58] Field of Search .................................... 206/713, 714, 206/716, 725

[56] References Cited

U.S. PATENT DOCUMENTS 4,966,281  10/1990  Kawanishi et al. ..................... 206/714
5,361,901  11/1994  Schenz et al. .......................... 206/714
5,400,904   3/1995  Maston, III et al. .................... 206/725
5,499,717   3/1996  Hayashi ................................. 206/716
5,664,680   9/1997  Hamlin .................................. 206/716

*Primary Examiner*—David T. Fidei
*Attorney, Agent, or Firm*—Dennison, Meserole, Pollack & Scheiner

[57] ABSTRACT

A carrier tape is provided with a large number of accommodating recesses with each recess having a bottom surface, the top surface being open to accept an electronic part. Each accommodating recess is provided with resilient retainer arms formed together as a unit extending from the top surface of the recess, the resilient retainer arms permitting the electronic part to be inserted into the recess but preventing it from falling off.

1 Claim, 4 Drawing Sheets

CARRIER TAPE

BACKGROUND OF THE INVENTION

1. Field of the Invention

The present invention relates to a carrier tape having a large number of recesses provided in a line to accommodate electronic parts.

2. Description of the Prior Art

In general, such an electronic part as ultra-LSI, register, connector, etc. has a large number of slender-leglike lead-frames projectingly formed around its periphery and these lead-frames are arranged at very narrow intervals. Accordingly, if the pitch between respective lead-frames is varied or the lead-frame itself is bent, it becomes impossible to install the electronic part in the predetermined location of an electric device. On this account, when the electronic parts are accommodated in the carrier tape, it is required to reliably prevent the discrepancy of pitches of the electronic parts. However, the carrier tape of the prior art has a problem. When the electronic part having such slender-leglike lead-frames is accommodated in the recess, vibration or the like makes the electronic part slip laterally in the accommodating recess, and such a lateral slip causes some lead-frames to be damaged.

SUMMARY OF THE INVENTION

Accordingly, the present invention is originated in order to solve the above-mentioned problem in the prior art, and it is the object of the present invention to provide a carrier tape that has an ability to reliably prevent the damage of electronic part with slender-leglike lead-frames around its periphery. The subject matter of the invention is a carrier tape having a large number of bottomed recesses with an open top provided in a line to accommodate electronic parts with a large number of slender-leglike lead-frames projectingly formed around the periphery, each of which recesses is provided with elastic fence boards on the bottom. The fence boards are positioned by the peripheral surface of the electronic part to be accommodated in the bottom and the top ends of the fence boards which are laid under the roots of the lead-frames. The fence boards are formed in a manner so that when the bottomed recesses are formed by drawing, the inside areas along the inner walls of the recess are upheaved leaving four corners of the bottom, and thereafter the upheaved areas are worked by punching along the inner walls so as to become erected into the inner vertical planes having top ends without a round shape.

DETAILED DESCRIPTION OF THE PREFERRED EMBODIMENT

An embodiment of the present invention will now be explained with reference to the accompanying drawings.

Figure 1:
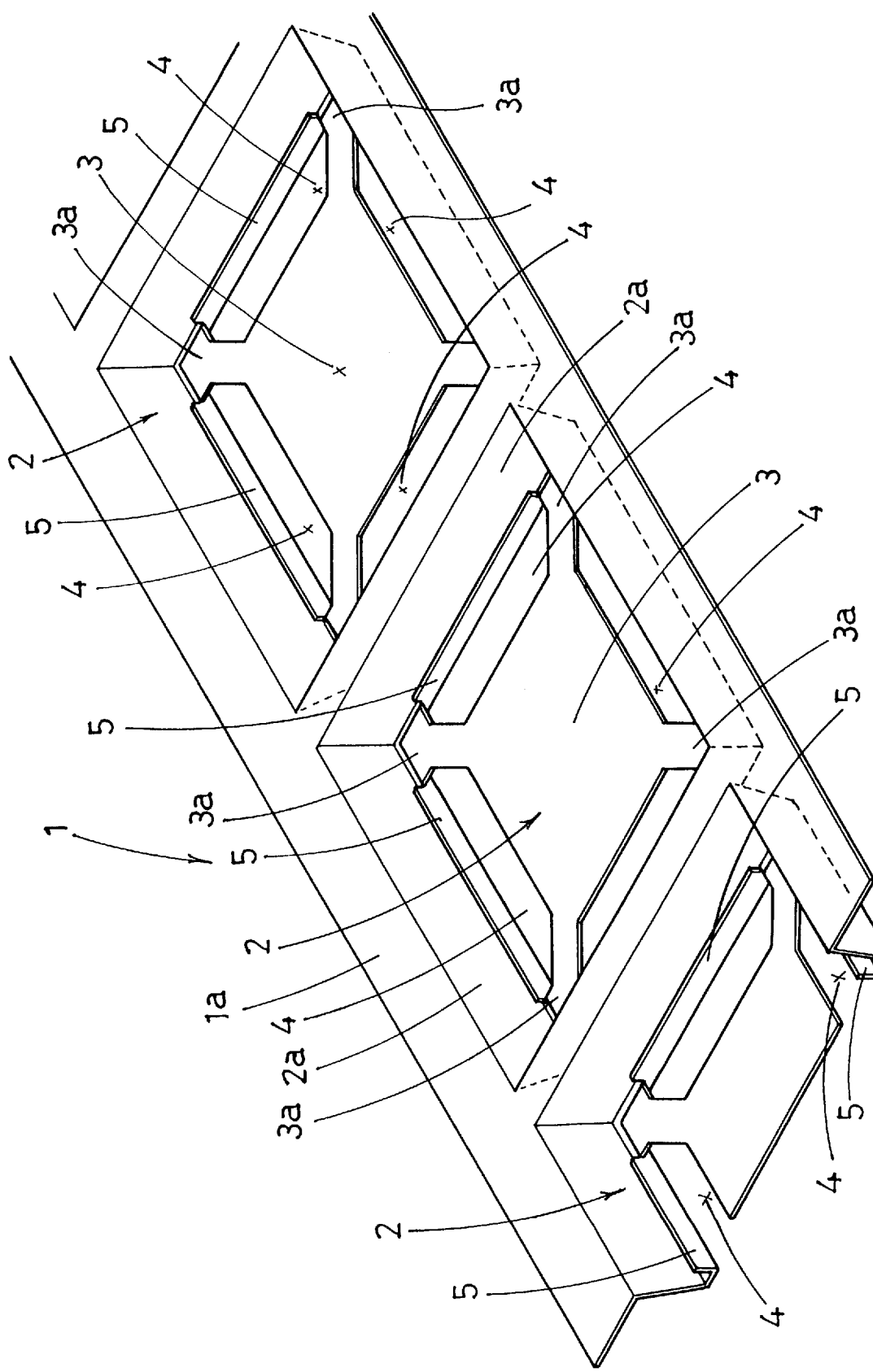
FIG. 1 is a perspective view of a carrier tape according to the present invention.
Figure 2:
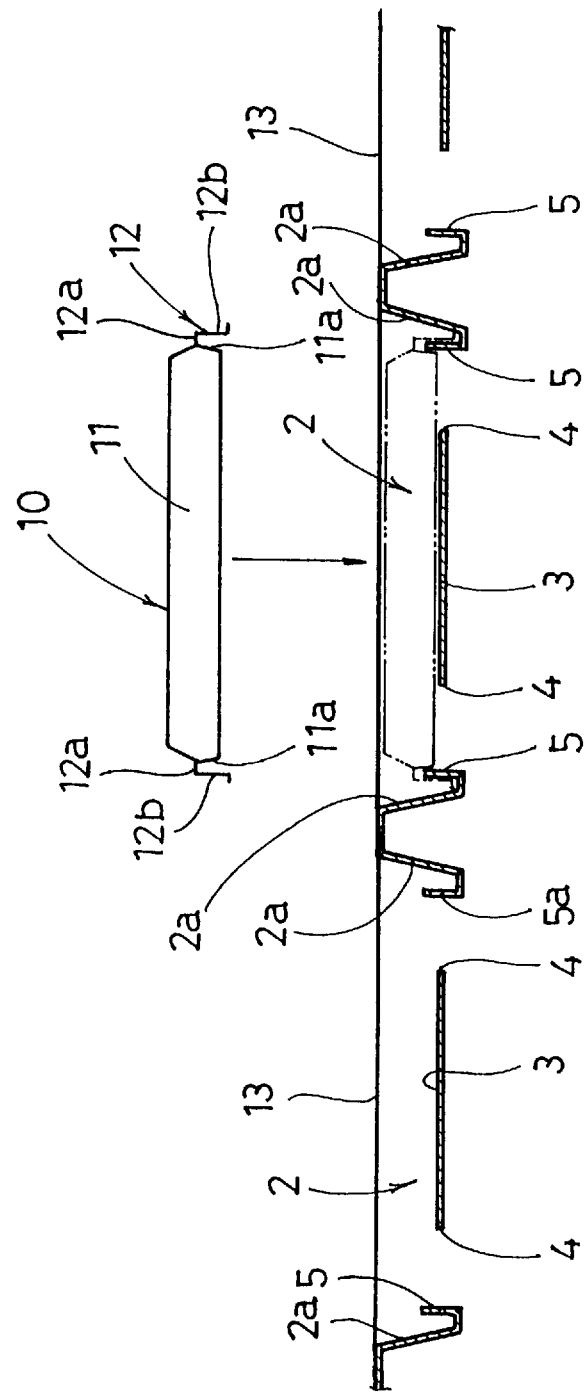
FIG. 2 is a sectional view of FIG. 1.

FIG. 1 is a perspective view of an embodiment of the carrier tape and FIG. 2 is a sectional view of FIG. 1.

In the drawings, there is shown a carrier tape 1, which is formed by drawing of a sheet such as polyethylene terephthalate (PET), polystyrene (PS), and thereafter partially formed by punching. The carrier tape 1 is provided with a large number of bottomed recesses 2, 2, 2 formed by drawing in a line along the longitudinal direction, and the bottom 3 of each bottomed recess 2 is provided with punched openings 4, 4, 4, 4 formed by punching in its four sides. The outsides of respective punched holes 4, 4, 4, 4 are integrally provided with elastic fence boards 5, 5, 5, 5 vertically erected on the four sides of the bottom 3. Further, the outside of each elastic fence board 5 is provided accross a gap with an inner wall 2a of the bottomed recess 2. This inner wall 2a is formed slanted and stretching toward the open topside.

Each bottomed recess 2 is formed in a rectangular shape by drawing, and a rectangular electronic part 10 is accommodated in each recess 2. As shown in FIG. 2, the electronic part 10 has a large number of lead-frames 12, 12, 12 projectingly formed at predetermined intervals around the periphery of the body 11. Each lead-frame 12 is formed in a slender-leglike shape composed of a horizontal portion 12a projecting laterally from the peripheral surface 11a of the body 11 and a vertical portion 12b extending downward from the outer end of the horizontal portion 12a.

When such an electronic part 10 is about to be accommodated in a bottomed recess 2 of the carrier tape 1, the electronic part 10 is disposed, as shown in FIG. 2, above the bottomed recess 2 with the body 11 of the part 10 held by a suction device (not shown) and slowly lowered in the bottomed recess 10 to be accommodated. In this case, since the inner walls 2a of the bottomed recess 2 are formed slanted, the electronic part 10 is lowered in a well positioning manner in the bottomed recess 2, and the bottom of the body 11 of the electronic part 10 is brought into contact with the bottom surface 3 of the recess 2, so that it is possible to enjoy the easy positioning of the electronic part 10.

Furthermore, in the condition that the body 11 of the electronic part 10 is in contact with the bottom surface 3, the above-described elastic fence boards 5 are fitted in the gap between the peripheral surface 11a of the body 11 and the vertical portion 12b of the lead-frames 12, and the top end of the elastic fence board 5 is laid narrowly under the horizontal portion 12a of the lead-frame 12. Each elastic fence board 5 is disposed nearly in contact with the peripheral surface 11a of the electronic part 10, so that the lateral slip of the electronic part 10 is reliably prevented in the bottomed recess 2 and no damage of the lead-frame 12 occurs.

Incidentally, each elastic fence board 5 is formed so that it may deflect toward the inner wall 2a because of its elasticity, while it is continuously formed from the inner wall 2a to be erected, so that it has enough strength to firmly hold the body 11 of the electronic part 10 in a clamped condition.

Figure 3:
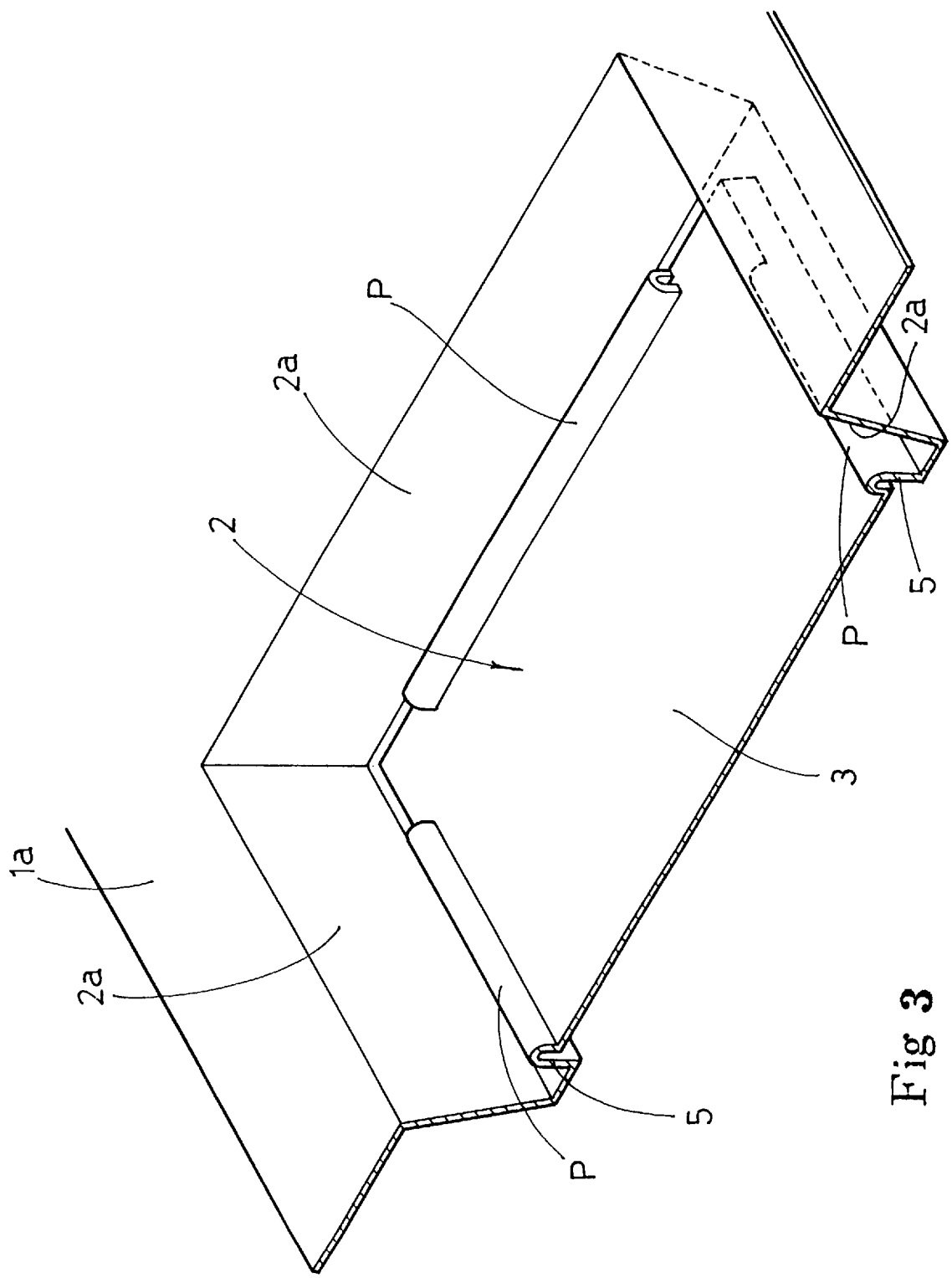
FIG. 3 is an enlarged perspective view of the principal portion of the carrier tape formed by drawing.
Figure 4:
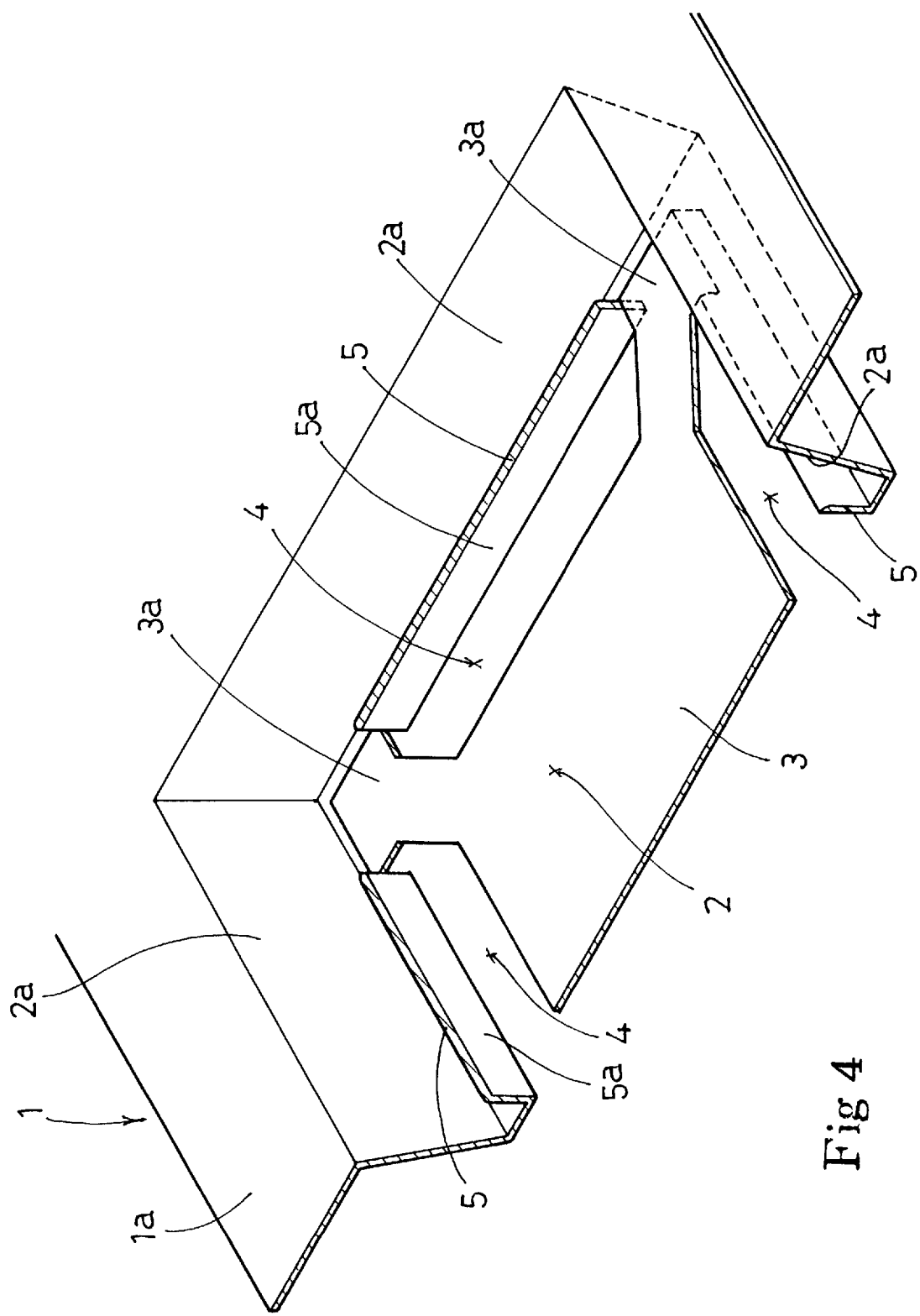
FIG. 4 is an enlarged perspective view of the principal portion of the carrier tape of which the fence boards are formed by punching to generate top ends without a round shape.

Now, the process to manufacture the elastic fence board 5 will be explained. First, as shown in FIG. 3, an enlarged perspective view of the principal portion, the carrier tape 1 is formed by drawing to make bottomed recesses 2 in a hollow shape. At the same time, four upheaved portions P, P, P, P are integrally formed by a drawing die respectively along the inside of the inner walls 2a on the bottom surface 3, having a top ends formed in the round shape. If the electronic part 10 is accommodated inside such upheaved portions P, which are disposed outside the outer peripheral surface 11a of the body 11, the electronic part 10 can climb over the round top end of the upheaved portion to slip laterally and the lead frame 12 can collide with the inner wall 2a to be damaged. In order to reliably prevent such a lateral slip, each of the above-described upheaved portions P is worked inside of it by punching, as shown in FIGS. 3 and 4, to form the punched hole 4 on the bottom surface 3 and the elastic fence board 5 is formed in the vertical plane outside the punched hole 4. By means of the punching work, each of the elastic fence boards 5 become vertically erect having the top end without a round shape, so that the vertical inside surface 5a is formed inside each elastic fence board 5. Accordingly, since the top end of each elastic fence board 5 is cut off to form a sharp edge, the elastic fence board 5 is erect to be nearly in contact with the peripheral surface 11a of the body 11 of the electronic part 10, well fitted between the the peripheral surface 11a of the body 11 and the vertical portion 12b of the lead frame 12. As a result, the body 11 of the electronic part 10 can not climb over the elastic fence board 5, which can prevent lateral slip of the body 11 of the electronic part 10, so that it becomes possible to prevent the lead frame 12 from colliding with the inner wall 2a.

Incidentally, since the four corners 3a, 3a, 3a, 3a on the bottom surface 3 are left without punching work and integrally formed together with the inner walls 2a and fence board 5, the elastic fence board 5 is fairly strong.

Besides, when the upheaved portion P is formed by drawing, as shown in FIG. 3, the thickness of the elastic fence board 5 is made thin because of the drawing operation. However, since the fence board 5 is formed integrally together with the four corners 3a and inner walls 2a, it is invested with considerable strength and elasticity and can prevent the lateral slip of the electronic part 10 at the peripheral surface 11a.

Further, when it is assumed that the original thickness of the sheet is about 0.3 mm, each elastic fence board 5 becomes 0.15 to 0.1 mm in thickness because of the drawing work, and in addition, the inner vertical surface 5a is formed by punching, so that it becomes thinner. Accordingly, the elastic fence board 5 can be fitted between the peripheral surface 11a of the electronic part 10 and the vertical portion 12b of the lead frame 12, so that it can firmly hold the body 11 of the electronic part 10 in a clamped condition.

Incidentally, the carrier tape 1 of the present embodiment is covered with a top covering sheet 13 over the top surface 1a after the electronic part 10 is accommodated in the bottomed recess 2.

As described above, the present invention is a carrier tape having a large number of bottomed recesses with the open top provided in a line to accommodate electronic parts with a large number of slender-leglike lead-frames projectingly formed around its periphery. Provided on the bottom of each recess are elastic fence boards, which are positioned by the peripheral surface of the electronic part to be accommodated in the bottom and the top ends of the fence boards are laid under the roots of the lead-frames. The fence boards are formed in a manner so that when the bottomed recesses are formed by drawing, the inside areas along the inner walls of the recess are upheaved leaving the four corners of the bottom, and thereafter the upheaved areas are worked by punching along the inner walls to be erected into the inner vertical planes having the top ends with a sharp edge as shown in FIG. 5.

Accordingly, by means of the punching work, each of the elastic fence board is vertically erected having the top end without round shape, so that the vertical inner surface is formed inside each elastic fence board. The elastic fence board is erected to be nearly in contact with the peripheral surface of the body of the electronic part, well fitted between the the peripheral surface of the body and the vertical portion of the lead frame. As a result, the elastic fence board can reliably prevent the body of the electronic part from slipping laterally, so that it becomes possible to prevent the lead-frame from being damaged.

What is claimed is:

1. A carrier tape having a plurality of recesses, each of the recesses having a bottom and an open top to accommodate electronic parts with a large number of slender-leglike lead-frames formed to project around the periphery and having a horizontal portion, the carrier tape comprising elastic fence boards provided on the bottom of each of said recesses, said elastic fence boards positioned so that the peripheral surface of the electronic part can be accommodated in a recess, the top ends of said elastic fence boards being positioned under the horizontal portion of the lead-frames, said elastic fence boards formed in a manner so that when the recesses are formed by drawing, portions of the bottom along inner walls of a recess are upheaved and generate four corners of a recess, the upheaved areas being punched along the inner walls to become said elastic fence boards with top ends having a sharp edge.

* * * * *